(12) United States Patent
Seki (10) Patent No.: US 6,859,905 B2
(45) Date of Patent: Feb. 22, 2005

(54) PARALLEL PROCESSING REED-SOLOMON ENCODING CIRCUIT AND METHOD

(75) Inventor: Katsutoshi Seki, Tokyo (JP)

(73) Assignee: NEC Corporation, Tokyo (JP)

( * ) Notice: Subject to any disclaimer, the term of this patent is extended or adjusted under 35 U.S.C. 154(b) by 683 days.

(21) Appl. No.: 09/795,324

(22) Filed: Mar. 1, 2001

(65) Prior Publication Data

US 2001/0023497 A1 Sep. 20, 2001

(30) Foreign Application Priority Data

Mar. 1, 2000 (JP) ........................................ 2000-055250

(51) Int. Cl.[7] ............................................. H03M 13/00
(52) U.S. Cl. ..................... 714/784; 714/756; 714/782
(58) Field of Search ............................... 714/784–786, 714/756–757

(56) References Cited

U.S. PATENT DOCUMENTS 5,912,905 A * 6/1999 Sakai et al. .................. 714/784
6,405,339 B1 * 6/2002 Cox et al. .................... 714/756

FOREIGN PATENT DOCUMENTS

| JP | 11-136136 | 5/1999 |
| JP | 11136136 A | 5/1999 |
| JP | 11-298447 | 10/1999 |

OTHER PUBLICATIONS

Hideki Imai, Japan Engineering Technology Center, "*Error Correction Encoding Techniques*", p. 30, 1986.

* cited by examiner

*Primary Examiner*—Guy J. Lamarre
(74) *Attorney, Agent, or Firm*—Young & Thompson (57) ABSTRACT

In a parallel processing Reed-Solomon encoding circuit that allows an arbitrary parallel processing number to be taken and the parallel processing number optimal to the system to be adopted, the multiplier factors corresponding to the first inputs of the first Galois field product sum circuit to the fourth Galois field product sum circuit are the zeroth to third order coefficients of the generator polynomial G(x). The multiplier factors corresponding to the second inputs are the zeroth to third order coefficients of a polynomial of a remainder from $x^5$ divided by the generator polynomial G(x). The multiplier factors corresponding to the third inputs are the zeroth to third order coefficients of a polynomial of a remainder from $x^6$ divided by the generator polynomial G(x).

10 Claims, 6 Drawing Sheets

PARALLEL PROCESSING REED-SOLOMON ENCODING CIRCUIT AND METHOD

BACKGROUND OF THE INVENTION

1. Field of the Invention

The present invention relates to a parallel processing Reed-Solomon encoding circuit, and more particularly to the error correction for any number (two or more) of blocks.

2. Description of the Related Art

Conventionally, a Reed-Solomon encoder has been well known which employs a method of a polynomial dividing circuit of shift register type as described in "Error Correction Encoding Techniques" supervised by Hideki Imai, Japan Engineering Technology Center, 1986), p.30 (hereinafter referred to as a document 1). However, this method does not allow the circuit to be operated at high rate, and is unsuitable for the Reed-Solomon encoding circuit that requires a high throughput as with an optical communication system of high speed and large capacity.

As the Reed-Solomon encoding circuit for realizing the high throughput, a system for making the parallel processing of polynomial division was proposed in Japanese Patent Laid-Open No. 11-136136 (hereinafter referred to as a document 2). To explain the system as proposed in this document 2, for example, an encoder is considered which produces an encoded signal of the code length of 16 bytes by appending a redundancy check signal of 4 bytes to an information signal of 12 bytes.

In this case, a signal of one byte can be converted into an element of a Galois field consisting of 256 elements, and vice versa. It is supposed that a primitive polynomial of the Galois field is $x^8+x^4+x^3+x^2+1$, and a primitive element is $\alpha$. An eleventh order information polynomial I(x) is considered having the coefficients consisting of information series ($I_{11}$, $I_{10}$, ..., $I_0$) with an information signal of 12 bytes converted into the Galois field.

From the product of I(x) and $x^4$ and the generator polynomial G(x), a third order check polynomial P(x) is obtained such as;

$$P(x) = I(x)x^4 \mod G(x) \quad (1)$$

$$G(x) = (x-\alpha)(x-\alpha^2) \ldots (x-\alpha^4) \quad (2)$$

The check polynomial P(x) is a remainder from I(x) $x^4$ divided by the fourth order generator polynomial G(x). The coefficients ($P_3$, ..., $P_0$) of this fourth order check polynomial P(x) are 4 bytes of the redundancy check signal. The encoded signal consists of the information signal of 12 bytes followed by the redundancy check signal of 4 bytes.

Herein, a case is considered in which when the signal is processed 2 bytes in parallel, for example, the division is made by the second order coefficient at a time. The coefficient of a Galois field multiplier portion within a parallel polynomial divider is obtained by the following transformation:

$$I(x)x^4 = \Sigma^i \quad (3)$$

$$G(x) = \Sigma g_i x^i \quad (4)$$

Where $\Sigma$ in an expression (3) denotes a sum for i=4 to 15, and $\Sigma$ in an expression (4) denotes a sum for i=0 to 4.

In the above expression, let G(x)=0. Then, $$x^4 = \Sigma g_i x^i \quad (5)$$

Substituting this into I(x) $x^4$ in succession, the remainder P(x) can be obtained. Where $\Sigma$ in an expression (5) denotes a sum for i=0 to 3.

From the expression (5), $$\begin{aligned}
I(x)x^4 &= \alpha_{15}x^{11}\Sigma ag_ix^i + \Sigma_b \alpha_i x^i \quad (6)\\
&= \alpha_{15}\Sigma_a g_i x^{i+11} + \Sigma_b \alpha_i x^i\\
&= \alpha_{15}g_3 x^{14} + \alpha_{15}\Sigma_c g_i x^{i+11} + \Sigma_b \alpha_i x^i\\
&= \alpha_{15}g_3\Sigma_a g_i x^{i+10} + \alpha_{15}\Sigma_c g_{i-1} x^{i+10} + \Sigma_b \alpha_i x^i\\
&= \Sigma_a \alpha_{15}(g_3 g_i + g^{i-1})x^{i+10} + \Sigma_b \alpha_i x^i\\
&= \Sigma_a \alpha_{15}(g_3 g_i + g_{i-1})x^{i+10} + \alpha_{14}\Sigma_a g_i x^{i+10} + \Sigma_d \alpha_i x^i\\
&= \Sigma_a \{\alpha_{15}(g_3 g_i + g_{i-1}) + g_i \alpha_{14}\} x^{i+10} + \Sigma_d \alpha_i x^i
\end{aligned}$$

(herein, $g_{-1} = 0$)

Where $\Sigma_a$ denotes a sum for i=0 to 3, $\Sigma_b$ denotes a sum for i=4 to 14, $\Sigma_c$ denotes a sum for i=0 to 2, and $\Sigma_d$ denotes a sum for i=4 to 13.

Herein, if $h_i$ is defined as $$h_i = g_3 g_i + g_{i-1} \quad (7)$$

an expression (6) is written such as $$I(x)x^4 = \Sigma_a \{\alpha_{15}h_i + \alpha_{14}g_i\} x^{i+10} + \Sigma_d \alpha_i x^i \quad (8)$$

In this way, the order of input data is decreased by two at a time. That is, this corresponds to the summation of the two-byte input data multiplied by g and h, and the next input value. This operation is repeated until the order is equal to 3, so that the check polynomial P(x) can be obtained.

Then, $h_i$, for example, can be simply calculated from the coefficient of the polynomial of the remainder from $x^5$ divided by G(x). If the same operation as above is performed, a circuit configuration for processing M bytes simultaneously can be considered.

Figure 6:
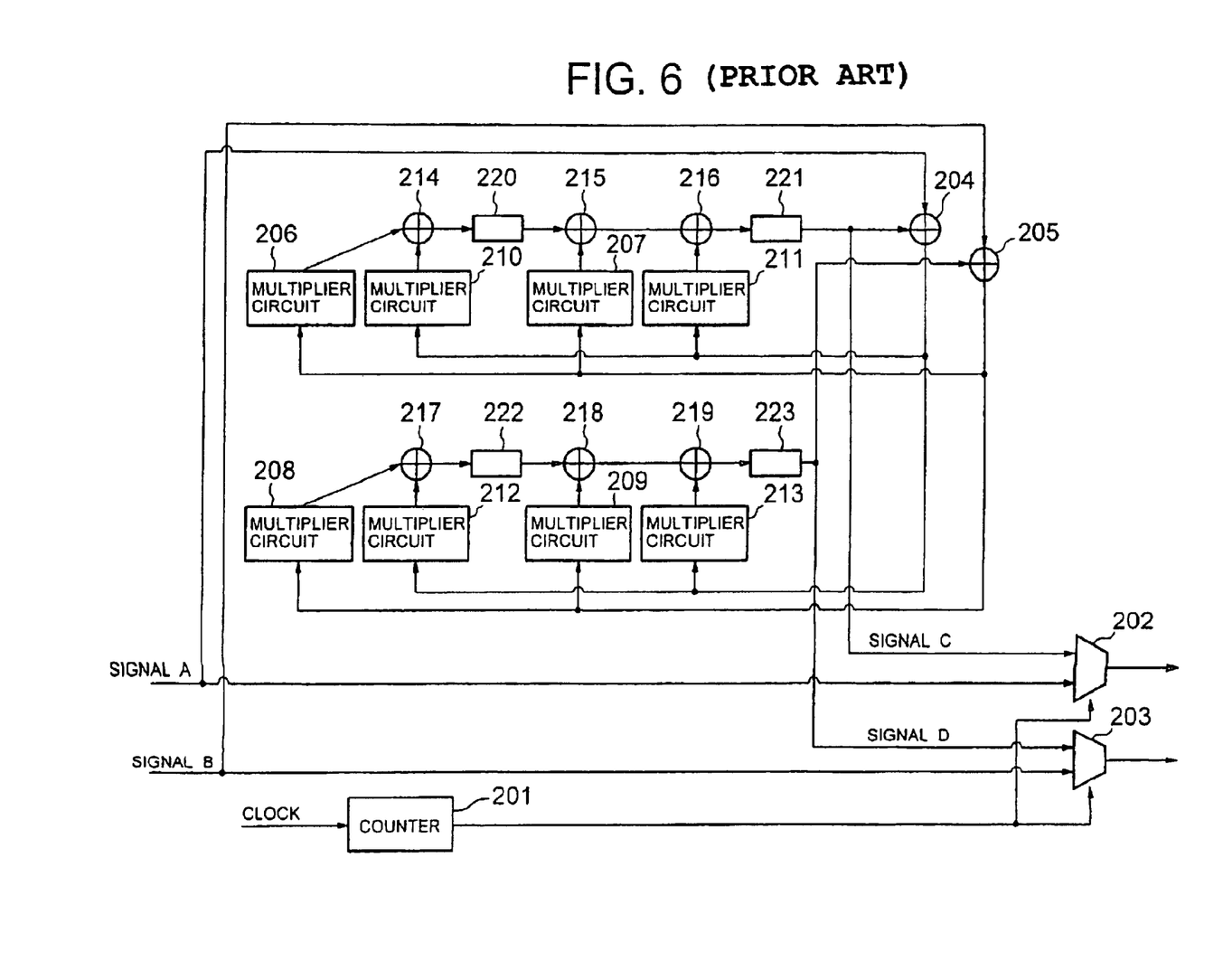
FIG. 6 is a block diagram showing the configuration of the conventional Reed-Solomon encoding circuit.

FIG. 6 is a block diagram of the above example. Referring to FIG. 6, a 16-bit signal and a clock at the same rate as the signal are input in parallel, the 16-bit signal being processed in a unit of one byte.

A two-byte signal is branched into two, a first byte is entered into the first input of a first selector circuit 202 and the first input of a first exclusive-OR circuit 204. Similarly, a second byte is entered into the first input of a second selector circuit 203 and the first input of a second exclusive-OR circuit 205. At this time, those signals are defined as A and B, respectively.

Each of the outputs from the first exclusive-OR circuit 204 and the second exclusive-OR circuit 205 is branched into four, wherein an output from the second exclusive-OR circuit 205 is entered into a first Galois field multiplier circuit 206, a second Galois field multiplier circuit 207, a third Galois field multiplier circuit 208, and a fourth Galois field multiplier circuit 209, and an output from the first exclusive-OR circuit 204 is entered into a fifth Galois field multiplier circuit 210, a sixth Galois field multiplier circuit 211, a seventh Galois field multiplier circuit 212, and an eighth Galois field multiplier circuit 213.

The multiplier factors of the first Galois field multiplier circuit 206, the second Galois field multiplier circuit 207, the third Galois field multiplier circuit 208, and the fourth Galois field multiplier circuit 209 are calculated from the coefficients of the generator polynomial G(x), those coefficients being $\alpha^{10}$, $\alpha^{81}$, $\alpha^{251}$ and $\alpha^{76}$, respectively.

Also, the multiplier factors of the fifth Galois field multiplier circuit 210, the sixth Galois field multiplier circuit 211, the seventh Galois field multiplier circuit 212, and the eighth Galois field multiplier circuit 213 are calculated from the remainder from $x^5$ divided by the generator polynomial G(x), those coefficients being $\alpha^{86}$, $\alpha^{63}$, $\alpha^{192}$ and $\alpha^{166}$, respectively. The outputs from the first Galois field multiplier circuit 206 and the fifth Galois field multiplier circuit 210 are exclusive-ORed in the third exclusive-OR circuit 214, and entered into a first D-F/F (D-flip-flop) 220.

The output of the first D-F/F 220, the output of the second Galois field multiplier circuit 207, and the output of the sixth Galois field multiplier circuit 211 are exclusive-ORed in the fourth exclusive-OR circuit 215 and the fifth exclusive-OR circuit 216, and entered into a second D-F/F 221.

Further, the output of the third Galois field multiplier circuit 208, and the output of the seventh Galois field multiplier circuit 212 are exclusive-ORed in the sixth exclusive-OR circuit 217, and entered into a third D-F/F 222. The output of the third D-F/F 222, the output of the fourth Galois field multiplier circuit 209, and the output of the eighth Galois field multiplier circuit 213 are exclusive-ORed in the seventh exclusive-OR circuit 218 and the eighth exclusive-OR circuit 219, and entered into a fourth D-F/F 223.

The output of the second D-F/F 221 is branched into two, one being entered into the second input of the first exclusive-OR circuit 204, and the other being entered into the first selector circuit 202. At this time, a signal entered into the first selector circuit 202 is designated as a signal C. Also, the output of the fourth D-F/F 223 is branched into two, one being entered into the second input of the second exclusive-OR circuit 205, and the other being entered into the second selector circuit 203. At this time, a signal entered into the second selector circuit 205 is designated as a signal D. A clock is input into the first D-F/F 220, the second D-F/F 221, the third D-F/F 222 and the fourth D-F/F 223, and a counter 201.

The first selector circuit 202 and the second selector circuit 203 select a signal depending on the value of the counter 201. The counter 201 is reset in accordance with the initial location of a frame format, the counter value being reset to be zero at every eight clocks.

In this example, if the value of the counter 201 is from 0 to 5, the signals A and B are selected, and if the value of the counter 201 is from 6 to 7, the signals C and D are selected. By adopting the above circuit configuration, a two-byte correctable (16, 12) Reed-Solomon encoding circuit can be configured. Since the use of such configuration allows two bytes to be processed at the same time, the same throughput of the polynomial dividing circuit of shift register type as described in the document 1 p.30 can be obtained with a half clock rate.

The above example is involved in the case where the code length N is divisible by the parallel processing number M. When the code length N is indivisible by the parallel processing number M, it is common that an initial auxiliary signal of the minimum natural number L where (N+L) is divisible by M is appended to the initial location of the information signal as described in the second example of the document 2.

In the conventional Reed-Solomon encoder as described above, the M D-F/F outputs in which the highest (K−1)th order to the (K−M)th order coefficients are preserved and the input signal are exclusive-ORed and entered into the Galois field multiplier circuit. This corresponds to a multiplication of the input signal by $x^K$.

Accordingly, the coefficient preserved in the D-F/F when the information signal I(x) is all input is a remainder from I(x) $x^K$ divided by the generator polynomial G(x), namely, a check signal P(x). Since M blocks are entered every time, the parallel processing number M is required to be a divisor of the input signal length N−K+L which is the sum of the lengths of the information signal and the initial auxiliary signal. Since the parallel processing number M is a divisor of N+L, it is required that the parallel processing number M may be a divisor of the redundancy check length K. Hence, there is a problem that arbitrary parallel processing number may not be taken. More specifically, the parallel processing number M must be a divisor of the redundancy check length K.

SUMMARY OF THE INVENTION

It is an object of the present invention to solve the above-mentioned problems, and provide a parallel processing Reed-Solomon encoding circuit and method which allows arbitrary parallel processing number to be taken and the parallel processing number optimal to the system to be employed.

According to the present invention, there is provided a parallel processing Reed-Solomon encoding circuit that separates in parallel an input signal of the code signal length N (N is a natural number) into the parallel processing number M (M is a natural number), divides a polynomial corresponding to the input signal by a generator polynomial to generate a redundant signal of the redundancy check length K (K is a natural number) corresponding to a remainder from the division, and multiplies the input signal having a terminal auxiliary signal of the terminal auxiliary signal length R appended at the end thereof by $x^{K-R}$, wherein the terminal auxiliary signal length R is a remainder from the redundancy check length K divided by the parallel processing number M.

According to the invention, there is also provided a parallel processing Reed-Solomon encoding method with the steps of separating in parallel an input signal of the code signal length N (N is a natural number) into the parallel processing number M (M is a natural number), dividing a polynomial corresponding to the input signal by a generator polynomial, to generate a redundant signal of the redundancy check length K (K is a natural number) corresponding to a remainder from the division, and multiplying the input signal having a terminal auxiliary signal of the terminal auxiliary signal length R appended at the terminal by $x^{K-R}$, wherein the terminal auxiliary signal length R is a remainder from the redundancy check length K divided by the parallel processing number M.

That is, the parallel processing Reed-Solomon encoding circuit of the invention can employ arbitrary parallel processing number, and realize a high throughput.

In the prior art, the M D-F/F outputs in which the highest (K−1)th order to the (K−M)th order coefficients are preserved and the input signal are exclusive-ORed and entered into the Galois field multiplier circuit. This corresponds to a multiplication of the input signal by $x^K$. Accordingly, the coefficient preserved in the D-F/F when the information signal I(x) is all input is a remainder from I(x) $x^K$ divided by the generator polynomial G(x), namely, a check signal P(x). Since M blocks are entered every time, the parallel processing number M is required to be a divisor of the input signal length N−K+L which is the sum of the lengths of the information signal and the initial auxiliary signal. Since the parallel processing number M is a divisor of N+L, it is required that the parallel processing number M be a divisor of the redundancy check length K.

In the invention, the M (K−1−R)th to (K−M−R)th D-F/F outputs in which the (K−1−R)th order to the (K−M−R)th order coefficients are preserved and the input signal are exclusive-ORed. This corresponds to a multiplication of the input signal by $x^{K-R}$. Supposing that the information signal polynomial is I(x), the input signal polynomial is represented as I(x) $x^R$ in consideration of the terminal auxiliary signal of R blocks.

Accordingly, the coefficient preserved in the D-F/F when the input signal is all entered is a remainder from I(x) $x^K$ divided by the generator polynomial G(x), namely, a check signal P(x). In this way, the parallel processing number M is not required to be a divisor of the redundancy check length K. Therefore, the parallel processing Reed-Solomon encoding circuit of the invention can take any value as the parallel processing number M.

DESCRIPTION OF THE PREFERRED EMBODIMENT

Figure 1:
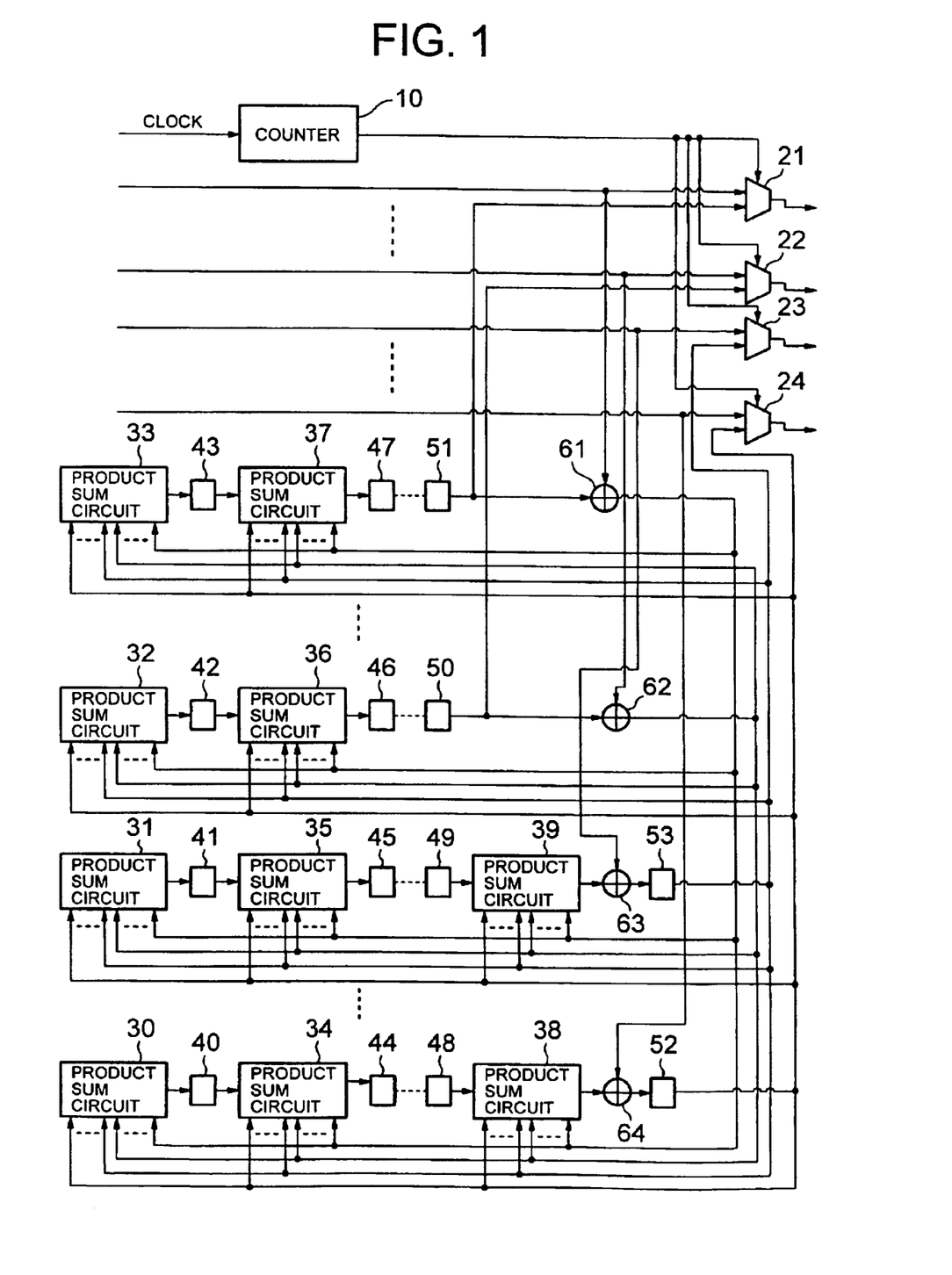
FIG. 1 is a block diagram showing the configuration of a parallel processing Reed-Solomon encoding circuit according to an embodiment of the present invention.

The preferred embodiments of the present invention will be described below with reference to the drawings. FIG. 1 is a block diagram showing the configuration of a parallel processing Reed-Solomon encoding circuit according to an embodiment of the invention. In FIG. 1, the parallel processing Reed-Solomon encoding circuit separates an input signal into M blocks in parallel, where the code signal length is N blocks, the redundancy check length is K blocks, and the parallel processing number is M. However, in the case where the code signal length N is indivisible by the parallel processing number M, an initial auxiliary signal is appended to the initial location of an information signal. The initial auxiliary signal length L is a minimum natural number L where (N+L) is divisible by M. The value of the initial auxiliary signal is set to 0.

The input signal separated in parallel into M block is branched into two, one being entered into the first input of a first selector circuit 24 to an M-th selector circuit 21, and the other being entered into the first input of a first exclusive-OR circuit 64 to an M-th exclusive-OR circuit 61. Supposing that the remainder from K divided by M is R, a terminal auxiliary signal of R blocks is appended to the end of the information signal to produce an input signal, because the input signal length N−K+L is indivisible by the parallel processing number M. The value of the terminal auxiliary signal of R blocks is set to 0.

The input signal is entered from the highest order coefficient of an information polynomial I(x). The highest order coefficient of the coefficients of M blocks to be processed in parallel is entered into the first input of the M-th exclusive-OR circuit 61 and the first input of the M-th selector circuit 21.

The outputs from the (R+1)th exclusive-OR circuit 62 to the Mth exclusive-OR circuit 61 are branched into K, and are entered into the first input to the (M−R)th input from the first Galois field product sum circuit 30 to the K-th Galois field product sum circuit 39. The outputs from the first exclusive-OR circuit 64 to the Rth exclusive-OR circuit 63 are entered into the (K−R+1)th D-F/F (D-flip-flop) 52 to the Kth D-F/F (D-flip-flop) 53, respectively.

The outputs from the (K−R+1)th D-F/F 52 to the Kth D-F/F 53 are branched into K+1, and are entered into the (M−R+1)th input to the Mth input from the first Galois field product sum circuit 30 to the Kth Galois field product sum circuit 39, and the second input of the first selector circuit 24 to the Rth selector circuit 23. The outputs from the first D-F/F 40 to the (K−M)th D-F/F 49 are entered into the (M+1)th input of the (M+1)th Galois field product sum circuit 34 to the K-th Galois field product sum circuit 39.

The outputs from the (K−M+1)th D-F/F 50 to the (K−R)th D-F/F 51 are branched into two, and are entered into the second input of the (R+1)th exclusive-OR circuit 62 to the Mth exclusive-OR circuit 61 and the second input of the (R+1)th selector circuit 22 to the Mth selector circuit 21.

The outputs of the first Galois field product sum circuit 30 to the (K−R) th Galois field product sum circuit (former Galois field product sum circuit of the (K−R)th D-F/F 51) (not shown) are entered into the first D-F/F 40 to the (K−R)th D-F/F 51. The outputs of the (K−R+1)th Galois field product sum circuit 52 to the Kth Galois field product sum circuit 53 are entered into the second input of the first exclusive-OR circuit 64 to the Rth exclusive-OR circuit 63.

A clock is input into a counter 10, which then outputs a control signal to the first selector circuit 24 to the Mth selector circuit 21 depending on the counter value. The first selector circuit 24 to the Mth selector circuit 21 output a first input while an information signal is being entered, and output a second input while the information signal is not being entered.

In this way, the M (K−1−R)th to (K−M−R)th D-F/F outputs in which the (K−1−R)th order to the (K−M−R)th order coefficients are preserved and the input signal are exclusive-ORed. This corresponds to a multiplication of the input signal by $x^{K-R}$. Supposing that the information signal polynomial is I(x), the input signal polynomial is represented as I(x) $x^R$ in consideration of the terminal auxiliary signal of R blocks.

Accordingly, the coefficient preserved in the D-F/F when the input signal is all entered is a remainder from I(x) $x^K$ divided by the generator polynomial G(x), namely, a check signal P(x). In this way, the parallel processing number M is not required to be a divisor of the redundancy check length K. Therefore, the parallel processing Reed-Solomon encoding circuit of the invention can take any value as the parallel processing number M.

Figure 2:
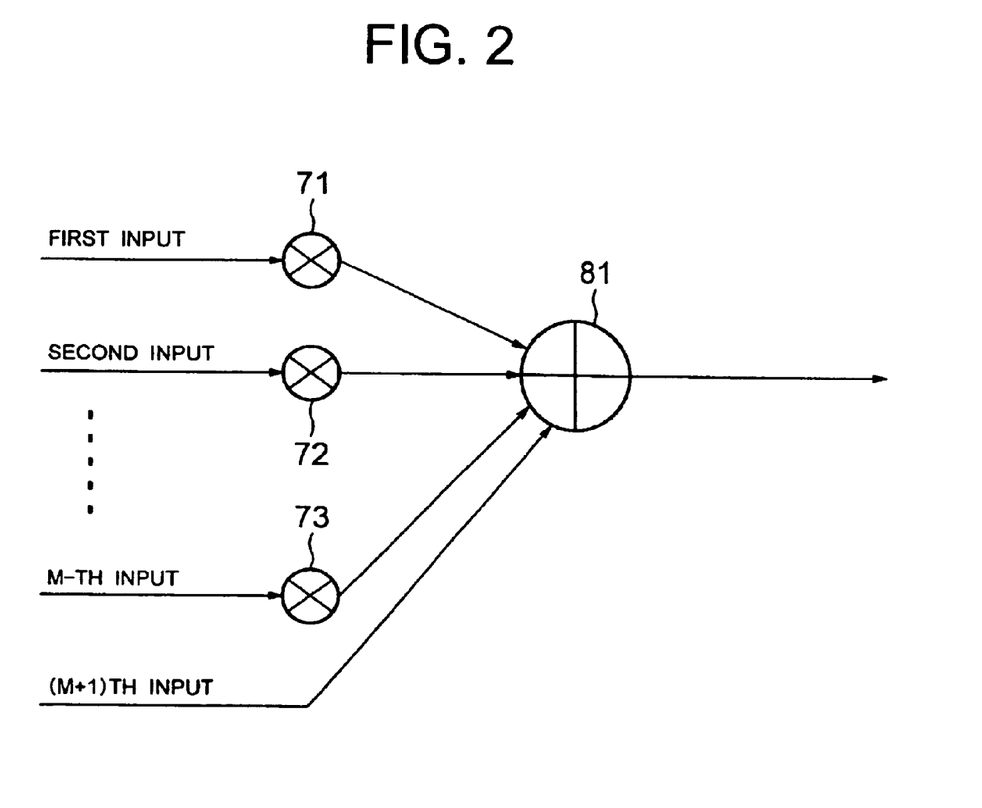
FIG. 2 is a block diagram showing the configuration of a Galois field product sum circuit according to the embodiment of the invention.

FIG. 2 is a block diagram showing the configuration of a Galois field product sum circuit according to the embodiment of the invention. In FIG. 2, the Galois field product sum circuit according to this embodiment of the invention multiplies the first to Mth input by a corresponding multiplier factor, and outputs an exclusive-OR of its result and the (M+1)th input, provided that the (M+1)th input of the first Galois product sum circuit 71 to the Mth Galois product sum circuit 73 is equal to zero. The multiplier factor corresponding to the ith input of the jth Galois field product sum circuit is the (j−1)th order coefficient of the polynomial for a remainder from $x^{k+i-1}$ divided by the generator polynomial G(x).

Figure 3:
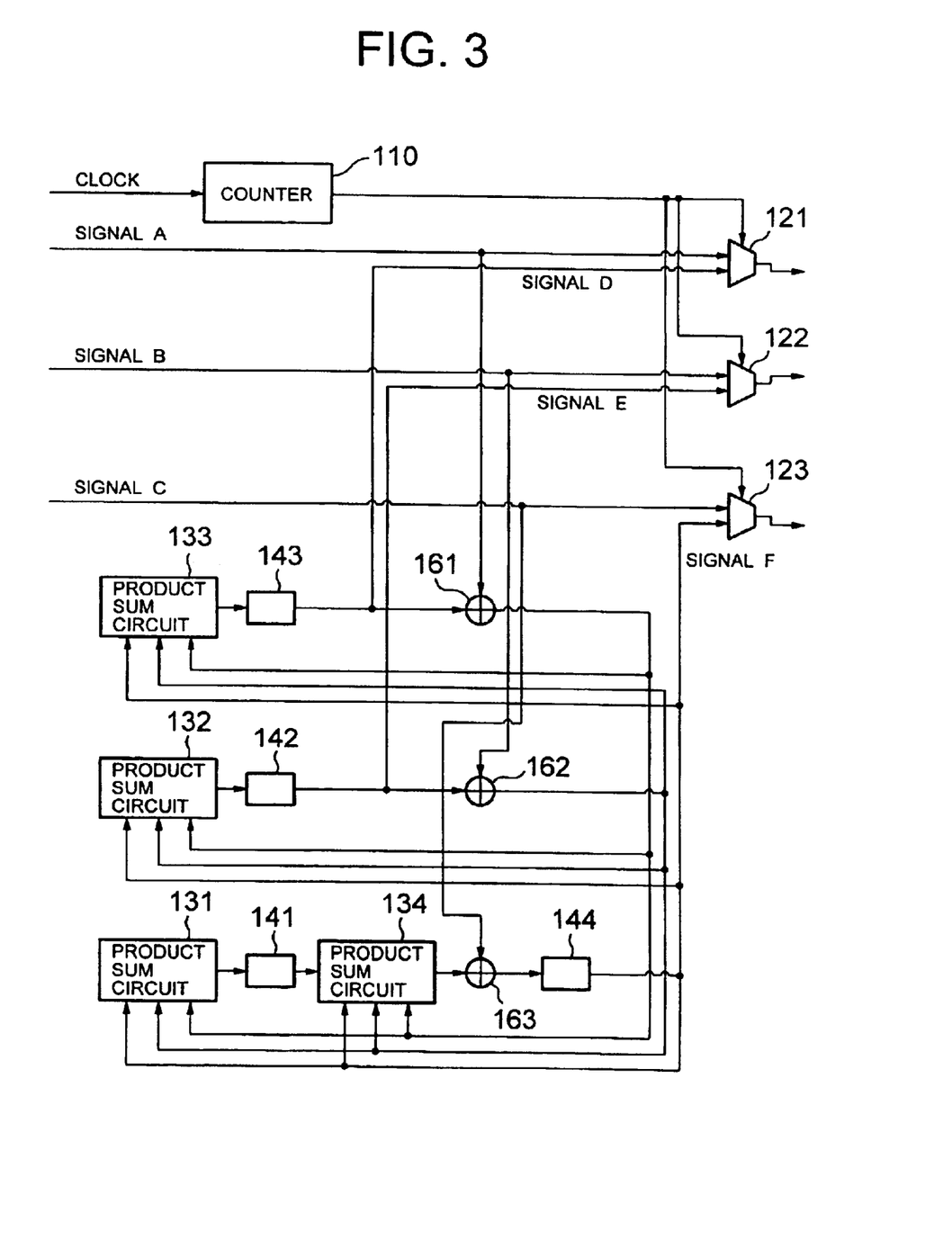
FIG. 3 is a block diagram showing the configuration of a Reed-Solomon encoding circuit according to the embodiment of the invention.

FIG. 3 is a block diagram showing the configuration of a Reed-Solomon encoding circuit according to one embodiment of the invention. Referring to FIG. 3, the circuit configuration of the Reed-Solomon encoding circuit according to this embodiment of the invention will be described below in connection with an instance where the code length is 15 bytes, the redundancy check length is 4 bytes, and the parallel processing number is 3.

The Reed-Solomon encoding circuit according to this embodiment comprises a counter 110, a first selector circuit 123 to a third selector circuit 121, a first Galois field product sum circuit 131 to a fourth Galois field product sum circuit 134, a first D-F/F 141 to a fourth D-F/F 144, and a first exclusive-OR circuit 163 to a third exclusive-OR circuit 161.

A 24-bit signal and a clock at the same rate as the signal are entered in parallel into the input, the 24-bit signal being processed in a unit of one byte. The three-byte signals are designated by A, B and C, respectively.

The counter 110 inputs the clock, and outputs a control signal from the first selector circuit 123 to the third selector circuit 121. The third selector circuit 121 inputs the control signal from the counter 110, an output from the third D-F/F 143, and a signal A, and outputs either the output of the third D-F/F 143 or the signal A in accordance with the control signal.

The second selector circuit 122 inputs the control signal from the counter 110, an output from the second D-F/F 142 and a signal B, and outputs either the output of the second D-F/F 142 or the signal B to the outside in accordance with the control signal.

The first selector circuit 123 inputs the control signal from the counter 110, an output from the fourth D-F/F 144 and a signal C, and outputs either the output of the fourth D-F/F 144 or the signal C to the outside in accordance with the control signal.

The first exclusive-OR circuit 163 inputs an output of the fourth Galois field product sum circuit 134 and the signal C, its exclusive-ORed result being output to the fourth D-F/F 144. The second exclusive-OR circuit 162 inputs an output of the second D-F/F 142 and the signal B, its exclusive-ORed result being branched into four and output to the second input of the first Galois field product sum circuit 131 to the fourth Galois field product sum circuit 134. The third exclusive-OR circuit 161 inputs an output of the third D-F/F 143 and the signal A, its exclusive-ORed result being branched into four and output to the third input of the first Galois field product sum circuit 131 to the fourth Galois field product sum circuit 134

The first D-F/F 141 inputs an output from the first Galois field product sum circuit 131, an input signal being delayed by one clock and output to the fourth input of the fourth Galois field product sum circuit 134. The second D-F/F 142 inputs an output from the second Galois field product sum circuit 132, an input signal being delayed by one clock and output to the second selector circuit 122 and the second exclusive-OR circuit 162.

The third D-F/F 143 inputs an output from the third Galois field product sum circuit 133, an input signal being delayed by one clock and output to the third selector circuit 121 and the third exclusive-OR circuit 161. The fourth D-F/F 144 inputs an output from the first exclusive-OR circuit 163, an input signal being delayed by one clock and output. The output signal is branched into five, and output to the first selector circuit 123, and the first input of the first Galois field product sum circuit 131 to the fourth Galois field product sum circuit 134.

The first Galois field product sum circuit 131 has an output of the fourth D-F/F 144 as the third input, an output of the second exclusive-OR circuit 162 as the first input, an output of the third exclusive-OR circuit 161 as the second input, and 0 as the fourth input. An operation result is output to the first D-F/F 141.

The second Galois field product sum circuit 132 has an output of the fourth D-F/F 144 as the third input, an output of the second exclusive-OR circuit 162 as the first input, an output of the third exclusive-OR circuit 161 as the second input, and 0 as the fourth input. An operation result is output to the second D-F/F 142.

The third Galois field product sum circuit 133 has an output of the fourth D-F/F 144 as the third input, an output of the second exclusive-OR circuit 162 as the first input, an output of the third exclusive-OR circuit 161 as the second input, and 0 as the fourth input. An operation result is output to the third D-F/F 143.

The fourth Galois field product sum circuit 134 has an output of the fourth D-F/F 144 as the third input, an output of the second exclusive-OR circuit 162 as the first input, an output of the third exclusive-OR circuit 161 as the second input, and an output of the first D-F/F 141 as the fourth input. An operation result is output to the first exclusive-OR circuit 163.

Figure 4:
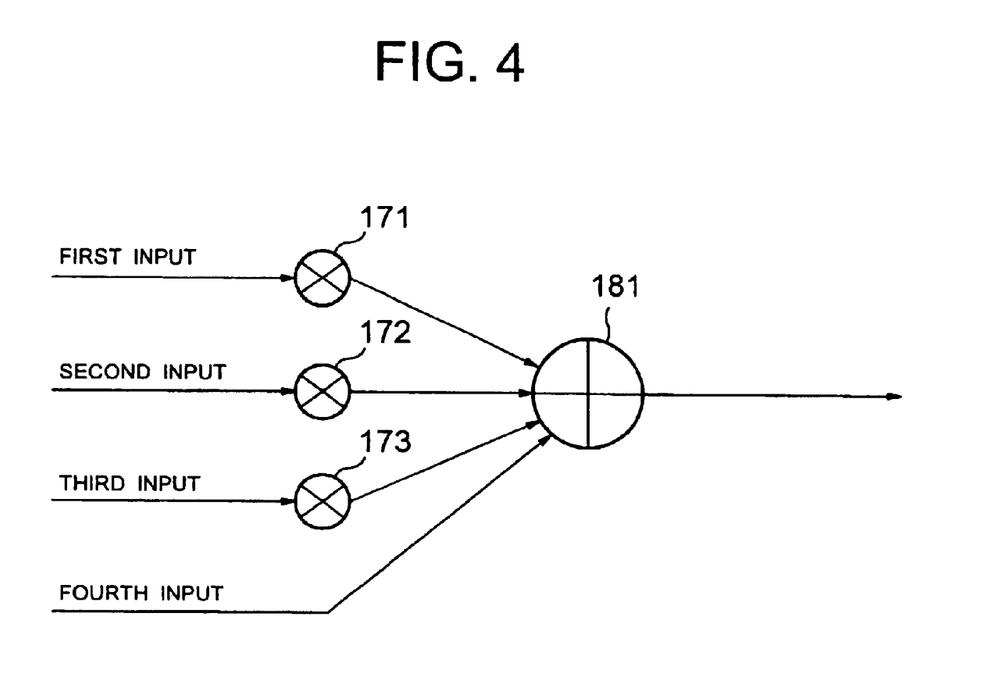
FIG. 4 is a block diagram showing the configuration of a Galois field product sum circuit according to the embodiment of the invention.

FIG. 4 is a block diagram showing the circuit configuration of a Galois field product sum circuit according to one embodiment of the invention. In FIG. 4, the Galois field product sum circuit according to this embodiment of the invention comprises the first Galois field multiplier circuit 171 to the third Galois field multiplier circuit 173, and a four-input exclusive-OR circuit 181.

The first Galois field multiplier circuit 171 has the first input as its input, and outputs a multiplication result to the four-input exclusive-OR circuit 181. The second Galois field multiplier circuit 172 has the second input as its input, and outputs a multiplication result to the four-input exclusive-OR circuit 181. The third Galois field multiplier circuit 173 has the third input as its input, and outputs a multiplication result to the four-input exclusive-OR circuit 181. The four-input exclusive-OR circuit 181 has as its input the outputs of the first Galois field multiplier circuit 171 to the third Galois field multiplier circuit 173 and the fourth input, and outputs its exclusive-ORed result.

Referring to FIGS. 3 and 4, the operation of the Reed-Solomon encoding circuit according to one embodiment of the invention will be described below in connection with an instance where the code length is 15 bytes, the redundancy check length is 4 bytes and the parallel processing number is 3.

Since the information length 11 of the input signal is indivisible by the parallel processing number 3, the input signal has a terminal auxiliary signal of one byte appended at the end of the information signal of one byte. The terminal auxiliary signal has a value of 0.

A 24-bit signal and a clock at the same rate as the signal are entered in parallel, the 24-bit signal being processed in a unit of one byte. An input signal is entered from the higher order coefficient of the information polynomial I(x). Of the signal of three bytes to be processed in parallel, the first byte corresponding to the highest coefficient is entered into the first input of the third selector circuit 121 and the first input of the third exclusive-OR circuit 163.

Similarly, the second byte is entered into the first input of the second selector circuit 122 and the first input of the second exclusive-OR circuit 162, and the third byte is entered into the first input of the first selector circuit 123 and the first input of the first exclusive-OR circuit 163. At this time, these signals are designated as A, B and C.

The first exclusive-OR circuit 163 exclusive-ORs an output of the fourth Galois field product sum circuit 134 and a signal C, its result being output to the fourth D-F/F 144. The second exclusive-OR circuit 162 exclusive-ORs an output of the second D-F/F 142 and a signal B, its result being branched into four and output to the second input of the first Galois field product sum circuit 131 to the fourth Galois field product sum circuit 134. The third exclusive-OR circuit 161 exclusive-ORs an output of the third D-F/F 143 and a signal A, its result being branched into four and output to the third input of the first Galois field product sum circuit 131 to the fourth Galois field product sum circuit 134.

The first D-F/F 141 delays an output from the first Galois field product sum circuit 131 by one clock and outputs a delayed result to the fourth input of the fourth Galois field product sum circuit 134. The second D-F/F 142 delays an output from the second Galois field product sum circuit 132 by one clock and outputs a delayed result to the second selector circuit 122 and the second exclusive-OR circuit 162. The third D-F/F 143 delays an output from the third Galois field product sum circuit 133 by one clock and outputs a delayed result to the third selector circuit 121 and the third exclusive-OR circuit 161. The fourth D-F/F 144 delays an output from the first exclusive-OR circuit 163 by one clock and outputs a delayed result to the first selector circuit 123 and the first input of the first Galois field product sum circuit 131 to the fourth Galois field product sum circuit 134.

The first Galois field product sum circuit 131 multiplies an output of the fourth D-F/F 144, an output of the second exclusive-OR circuit 162, and an output of the third exclusive-OR circuit 161 by corresponding multiplier factors, respectively, its exclusive-ORed result being output to the first D-F/F 141. The second Galois field product sum circuit 132, the third Galois field product sum circuit 133 and the fourth Galois field product sum circuit 134 perform the same operation as the first Galois field product sum circuit 131, the results being output to the second D-F/F 142, the third D-F/F 143 and the first exclusive-OR circuit 163, respectively.

The multiplier factors corresponding to the first inputs of the first Galois field product sum circuit 131 to the fourth Galois field product sum circuit 134 are the zeroth to third order coefficients of the generator polynomial G(x). The multiplier factors corresponding to the second inputs of the first Galois field product sum circuit 131 to the fourth Galois field product sum circuit 134 are the zeroth to third order coefficients of a polynomial of a remainder from $x^5$ divided by the generator polynomial G(x). The multiplier factors corresponding to the third inputs of the first Galois field product sum circuit 131 to the fourth Galois field product sum circuit 134 are the zeroth to third order coefficients of a polynomial of a remainder from $x^6$ divided by the generator polynomial G(x).

The outputs of the third exclusive-OR circuit 161 and the second exclusive-OR circuit 162 are designated as D and E, respectively. Also, the output of the fourth D-F/F 144 is designated as F.

The first selector circuit 121 to the third selector circuit 123 output the signals A, B and C, respectively, while the information signal is being entered, or otherwise, output D, E and F, respectively. Specifically, the first selector circuit 121 to the third selector circuit 123 selects the signal, depending on the value of the counter 110. The counter 110 is reset in accordance with the initial location of the frame format, and set so that the counter value may be zero at every five clocks.

In this embodiment, the signals A, B and C are selected when the counter value is from 0 to 2, the signals A, B and F are selected when the counter value is equal to 3, and the signals D, E and F are selected when the counter value is equal to 4.

By adopting the above configuration, the two-byte correctable (15, 11) Reed-Solomon encoding circuit can be configured. Since the use of such a configuration allows three bytes to be processed at the same time, the same throughput of a polynomial dividing circuit of shift register type as described in the document 1 p.30 can be obtained with a one-third clock rate.

Conventionally, there is the problem that arbitrary parallel processing number can not be taken, and more specifically, the parallel processing number M must be a divisor of the redundancy check length K. However, this invention permits arbitrary parallel processing number to be taken, whereby it is possible to adopt the parallel processing number optimal to the system.

Figure 5:
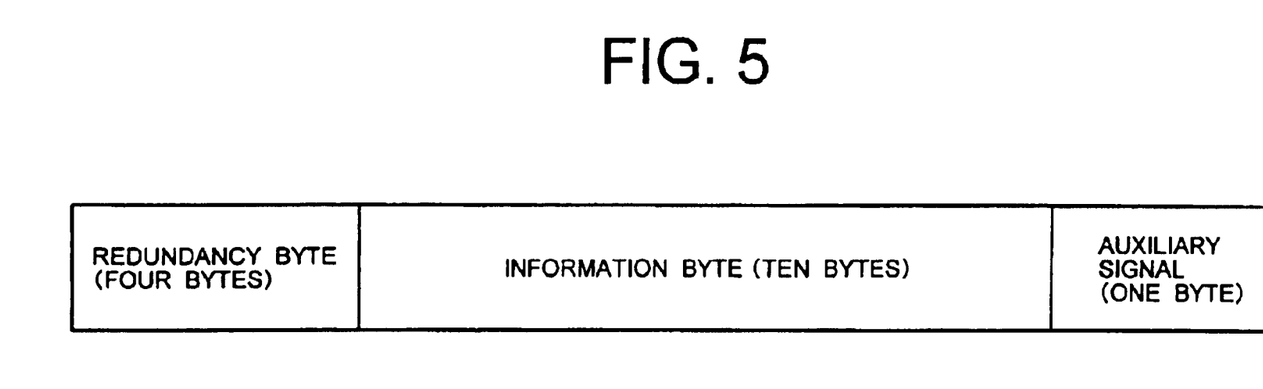
FIG. 5 is a diagram showing the frame format in another embodiment of the invention.

In a case where the code length is 14 bytes, the information length is 10 bytes, the redundancy check length is 4 bytes and the parallel processing number is 3, the code length is divisible by the parallel processing number 3, with a remainder of 1. In this case, an initial auxiliary signal of one byte is appended at the initial location of the frame format. FIG. 5 shows a frame format according to another embodiment of the invention. The value of the initial auxiliary signal is set to zero.

In this way, using the initial auxiliary signal, the parallel processing can be made by the same circuit as that of one embodiment of the invention. However, the initial auxiliary signal is not subjected to the error correction.

Typically, by appending an initial auxiliary signal with a minimum natural number L where (N+L) is divisible by M for the code length N and the parallel processing number M, a parallel encoding circuit can be implemented, even when the code length N is indivisible by the parallel processing number M. The present invention is applicable to all the block codes using the polynomial divider such as the BCH (Bose Chaudhuri Hocquenghem) code.

As described above, this invention can provide a parallel processing Reed-Solomon encoding circuit for separating in parallel an input signal of code signal length N (N is a natural number) into parallel processing number M (M is a natural number), and making a division of a polynomial corresponding to the input signal by a generator polynomial, to generate a redundant signal of redundancy check length K (K is a natural number) corresponding to a remainder from the division, comprising means for multiplying the input signal with a terminal auxiliary signal of terminal auxiliary signal length R appended at terminal by $x^{K-R}$, wherein the terminal auxiliary signal length R is a remainder from the redundancy check length K divided by the parallel processing number M. Accordingly, this invention has the effect of permitting arbitrary parallel processing number to be taken, thereby enabling the parallel processing number optimal to the system to be employed.

What is claimed is:

1. A parallel processing Reed-Solomon encoding circuit, comprising:

means for separating in parallel an input signal of code signal length N (N is a natural number) into parallel processing number M (M is a natural number), means for dividing a polynomial corresponding to said input signal by a generator polynomial, to generate a redundant signal of redundancy check length K (K is a natural number) corresponding to a remainder from said division, and means for multiplying $x^{K-R}$ times said input signal, where said input signal has a terminal auxiliary signal of terminal auxiliary signal length R appended at an end of said input signal, and where said terminal auxiliary signal length R is a remainder from said redundancy check length K divided by said parallel processing number M.

2. The parallel processing Reed-Solomon encoding circuit according to claim 1, wherein said input signal has an initial auxiliary signal of the initial auxiliary signal length L appended at a beginning of said input signal, when said code signal length N is indivisible by said parallel processing number M, and wherein said initial auxiliary signal length L is a minimum natural number where (N+L) is divisible by said parallel processing number M, and has a value of 0.

3. The parallel processing Reed-Solomon encoding circuit according to claim 1, wherein the value of a terminal auxiliary signal of said terminal auxiliary signal length R is equal to 0.

4. The parallel processing Reed-Solomon encoding circuit according to claim 1, wherein said means for multiplying by $x^{K-R}$ makes an exclusive OR operation between M (K−1−R)th to (K−M−R)th flip-flop circuit outputs for preserving the (K−1−R)th order to (K−M−R)th order coefficients and said input signal and inputs a result into a Galois field operation circuit.

5. The parallel processing Reed-Solomon encoding circuit according to claim 1, wherein is applicable to all block codes using a polynomial divider that is a BCH (Bose Chaudhuri Hocquenghem) code.

6. A parallel processing Reed-Solomon encoding method, comprising the steps of:

separating in parallel an input signal of code signal length N (N is a natural number) into parallel processing number M (M is a natural number), dividing a polynomial corresponding to said input signal by a generator polynomial, to generate a redundant signal of redundancy check length K (K is a natural number) corresponding to a remainder from said division, and multiplying $x^{K-R}$ times said input signal, where said input signal has a terminal auxiliary signal of terminal auxiliary signal length R appended at an end of said input signal, and where said terminal auxiliary signal length R is a remainder from said redundancy check length K divided by said parallel processing number M.

7. The parallel processing Reed-Solomon encoding method according to claim 6, wherein said input signal has an initial auxiliary signal of the initial auxiliary signal length L appended at a beginning of said input signal, when said code signal length N is indivisible by said parallel processing number M, and wherein said initial auxiliary signal length L is a minimum natural number where (N+L) is divisible by said parallel processing number M, and has a value of 0.

8. The parallel processing Reed-Solomon encoding method according to claim 6, wherein the value of a terminal auxiliary signal of said terminal auxiliary signal length R is equal to 0.

9. The parallel processing Reed-Solomon encoding method according to claim 6, wherein the step of multiplying said input signal by $x^{K-R}$ comprises making an exclusive OR operation between M (K−1−R)th to (K−M−R)th flip-flop circuit outputs for preserving the (K−1−R)th order to (K−M−R)th order coefficients and said input signal and inputting a result into a Galois field operation circuit.

10. The parallel processing Reed-Solomon encoding method according to claim 6, which is applicable to all block codes using a polynomial divider that is a BCH (Bose Chaudhuri Hocquenghem) code.

* * * * *